US012631971B2

(12) United States Patent
Lee et al.

(10) Patent No.: US 12,631,971 B2
(45) Date of Patent: May 19, 2026

(54) IMMERSION LITHOGRAPHIC SYSTEM

(71) Applicant: Samsung Electronics Co., Ltd.,
Suwon-si (KR)

(72) Inventors: Wonki Lee, Suwon-si (KR);
Hyoungsoo Kim, Daejeon (KR); **Junill
Ryu, Daejeon (KR); Namil Koo**,
Suwon-si (KR); Jongmin Yoon,
Suwon-si (KR); Suhwan Park,
Suwon-si (KR); Sangyeon Oh,
Suwon-si (KR); Gilgu Lee, Daejeon
(KR)

(73) Assignees: Samsung Electronics Co., Ltd.,
Gyeonggi-do (KR); **Korea Advanced
Institute of Science and Technology,**
Daejeon (KR)

( * ) Notice: Subject to any disclaimer, the term of this
patent is extended or adjusted under 35
U.S.C. 154(b) by 121 days.

(21) Appl. No.: 18/337,982

(22) Filed: Jun. 20, 2023

(65) Prior Publication Data

US 2024/0152058 A1     May 9, 2024

(30) Foreign Application Priority Data

Nov. 4, 2022    (KR) ........................ 10-2022-0146388

(51) Int. Cl.
*G03F 7/20*          (2006.01)
*G03F 7/00*          (2006.01)
(52) U.S. Cl.
CPC ...... *G03F 7/70341* (2013.01); *G03F 7/70883*
(2013.01)

(58) Field of Classification Search
CPC .......................... G03F 7/70341; G03F 7/70883
See application file for complete search history.

(56) References Cited

U.S. PATENT DOCUMENTS

| | | |
|---|---|---|
| 5,660,642 A | 8/1997 | Britten |
| 6,555,017 B1 | 4/2003 | Rushford et al. |
| 7,367,345 B1 | 5/2008 | Hemker et al. |
| 7,414,699 B2 | 8/2008 | Belfroid et al. |
| 7,576,833 B2 | 8/2009 | Poon et al. |
| 7,580,112 B2 | 8/2009 | Sogard |
| 7,749,689 B2 | 7/2010 | Hemker et al. |
| 7,804,574 B2 | 9/2010 | Streefkerk et al. |
| 8,004,651 B2 | 8/2011 | Nagasaka |

(Continued)

OTHER PUBLICATIONS

K.G. Winkels et al., 'Receding contact lines: From sliding drops to
immersion lithography' *European Special Physical Journal Special
Topics*, vol. 192, Mar. 2011, pp. 195-205.

(Continued)

*Primary Examiner* — Mesfin T Asfaw
(74) *Attorney, Agent, or Firm* — HARNESS, DICKEY &
PIERCE, P.L.C.

(57) ABSTRACT

An immersion lithographic system may include a wafer
stage configured to support a wafer, a projection optical
system on the wafer stage and configured to irradiate light
toward the wafer, a liquid supply unit configured to supply
a liquid between the wafer stage and the projection optical
system to form an immersion lens through which the light is
transmitted, and a vapor supply unit configured to supply
vapors to the immersion lens. The immersion lens and the
vapor supply unit may be aligned in a vertical direction.

19 Claims, 5 Drawing Sheets

1

(56)     References Cited

U.S. PATENT DOCUMENTS

| 8,614,784 B2 | 12/2013 | Riepen et al. | |
|---|---|---|---|
| 8,755,028 B2 | 6/2014 | Kemper et al. | |
| 9,618,852 B2 | 4/2017 | Coon et al. | |
| 10,551,748 B2 * | 2/2020 | Rops ................... | G03F 7/70716 |
| 11,327,404 B2 | 5/2022 | Donders et al. | |
| 2010/0313974 A1 * | 12/2010 | Riepen ................ | G03F 7/70341 |
| | | | 137/560 |
| 2012/0069309 A1 | 3/2012 | Willems et al. | |
| 2019/0121244 A1 | 4/2019 | Nagasaka | |

OTHER PUBLICATIONS

Junil Ryu et al., 'Volatile vapor knife of immersion lithography hood using solutal Marangoni effect' *Journal of Vacuum Science and Technology B*, vol. 40, Sep. 2022, pp. 052601-1-052601-6.
Hyoungsoo Kim et al., 'Experimental and theoretical study of dewetting corner flow' *J. Fluid. Mech.*, vol. 762, Jan. 2015, pp. 393-416.
Junil Ryu et al., 'Vapor Absorption and Marangoni Flows in Evaporating Drops' *Langmuir*, vol. 38, 2022, pp. 2185-2191.

* cited by examiner

IMMERSION LITHOGRAPHIC SYSTEM

CROSS-REFERENCE TO RELATED APPLICATION

This application is based on and claims priority under 35 U.S.C. § 119 to Korean Patent Application No. 10-2022-0146388, filed on Nov. 4, 2022, in the Korean Intellectual Property Office, the disclosure of which is incorporated by reference herein in its entirety.

BACKGROUND

Inventive concepts relate to an immersion lithographic system. More specifically, inventive concepts relate to an immersion lithographic system including an immersion lens and a meniscus.

In immersion lithography, in order to improve system performance, an immersion lithography process is performed in a state where a gap between a lens in a projection optical system and a wafer is completely filled with liquid.

Generally, in the immersion lithography process, the numerical aperture (NA) is defined by the following equation.

$$NA = n \, \text{Sin} \, \alpha$$

In the equation above, n is a refractive index, and $\alpha$ is an angle between an optical axis of a lens and the outermost ray of light entering an objective lens. In other words, the higher the NA is and the shorter a wavelength of a light source is, the better a resolution is. The immersion lithography process has the advantage that improved resolution may be provided by achieving a numerical aperture of NA>1, in particular, a numerical aperture of NA=1.3 or more, by using an immersion fluid. In particular, when water ($H_2O$) is used as the immersion fluid, a resolution and depth of focus (DOF) may be improved by providing a high refractive index of n=1.44, compared to a typical immersion lithography process.

SUMMARY

Inventive concepts provide an immersion lithographic system with improved reliability by including an immersion lens and a meniscus.

According to an example embodiment of inventive concepts, an immersion lithographic system may include a wafer stage configured to support a wafer, a projection optical system on the wafer stage and configured to irradiate light toward the wafer, a liquid supply unit configured to supply a liquid between the wafer stage and the projection optical system to form an immersion lens through which the light is transmitted, and a vapor supply unit configured to supply vapors to the immersion lens. The immersion lens and the vapor supply unit may be aligned in a vertical direction.

According to an example embodiment of inventive concepts, an immersion lithographic system may include a wafer stage configured to support and move a wafer; a projection optical system on the wafer stage and configured to irradiate light toward the wafer; a liquid supply unit configured to supply a liquid between the wafer stage and the projection optical system to form an immersion lens through which the light is transmitted, the liquid supply unit including at least one liquid supply line and a plurality of liquid recovery lines; and a vapor supply unit configured to supply vapors between the wafer stage and the projection optical system, the vapor supply unit including a plurality of vapor supply lines and a plurality of vapor recovery lines. The projection optical system may include a head portion disposed at a lower portion of the projection optical system. The at least one liquid supply line, the plurality of liquid recovery lines, the plurality of vapor supply lines, and the plurality of vapor recovery lines may be arranged in the head portion. The immersion lens may include a meniscus forming a contact angle of 90° or less with the wafer. The vapors supplied from the vapor supply unit may reduce a capillary number of the immersion lens.

According to an example embodiment of inventive concepts, an immersion lithographic system may include a light source configured to generate and irradiate light; an illumination optical system configured to irradiate the light to a reticle; a wafer stage configured to support and move a wafer; a projection optical system facing the wafer stage and configured to irradiate, toward the wafer, the light that has passed through the reticle; a liquid supply unit configured to supply a liquid between the wafer stage and the projection optical system to form an immersion lens through which the light is transmitted, and including at least one liquid supply line and a plurality of liquid recovery lines; and a vapor supply unit configured to supply vapors between the wafer stage and the projection optical system, the vapor supply unit including a plurality of vapor supply lines and a plurality of vapor recovery lines. The projection optical system may include a head portion at a lower portion of the projection optical system. The at least one liquid supply line, the plurality of liquid recovery lines, the plurality of vapor supply lines, and the plurality of vapor recovery lines may be in the head portion. The immersion lens may include a meniscus forming a contact angle of 90° or less with the wafer. The vapors supplied from the vapor supply unit may reduce a capillary number of the immersion lens, and the immersion lens and the vapor supply unit are aligned in a vertical direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
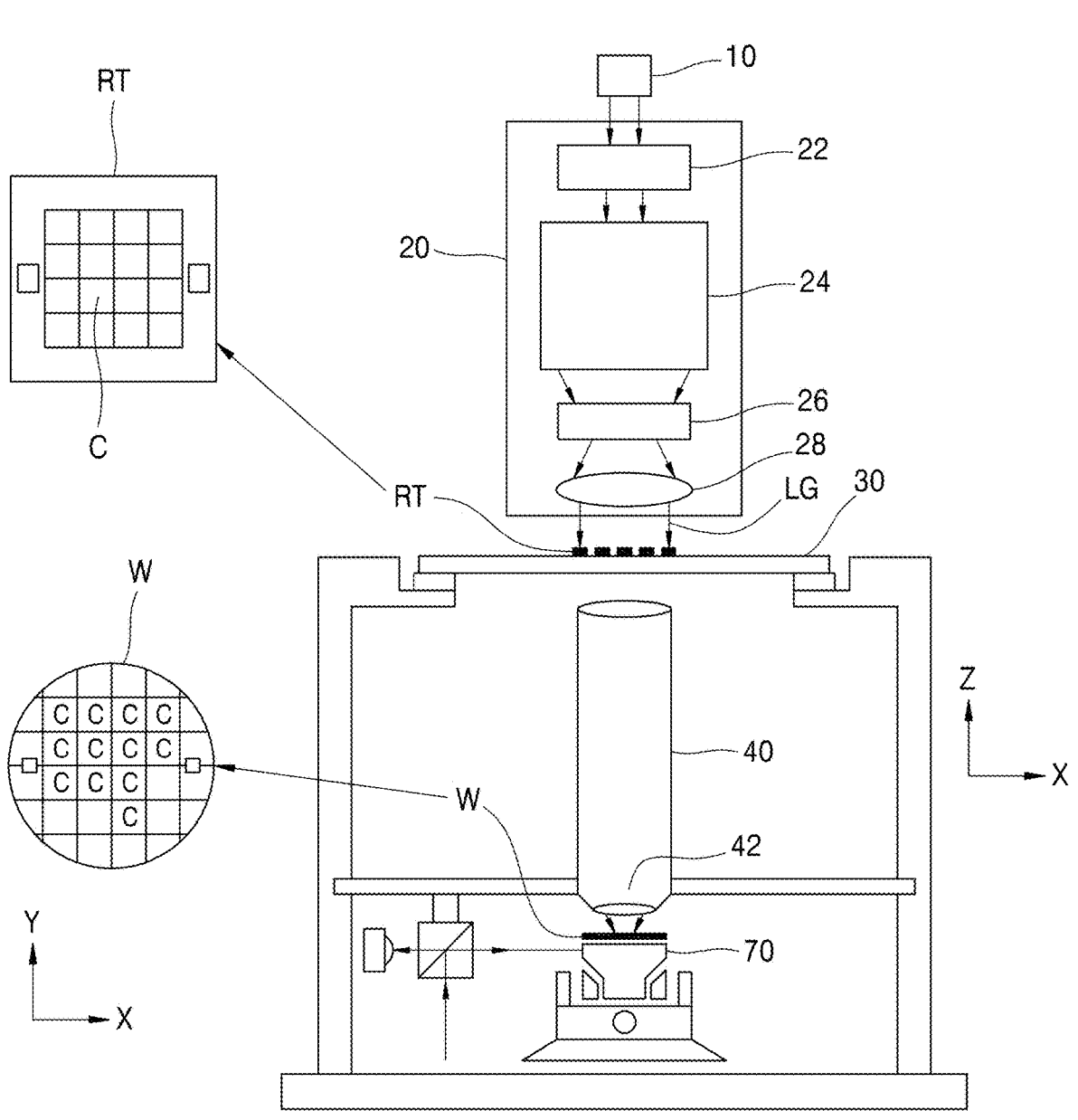
FIG. 1 is a schematic configuration diagram of an exposure apparatus according to an embodiment.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, embodiments of inventive concepts will be described in detail with reference to the accompanying drawings. In the drawings, like numerals denote like elements and redundant descriptions thereof will be omitted.

Figure 2:
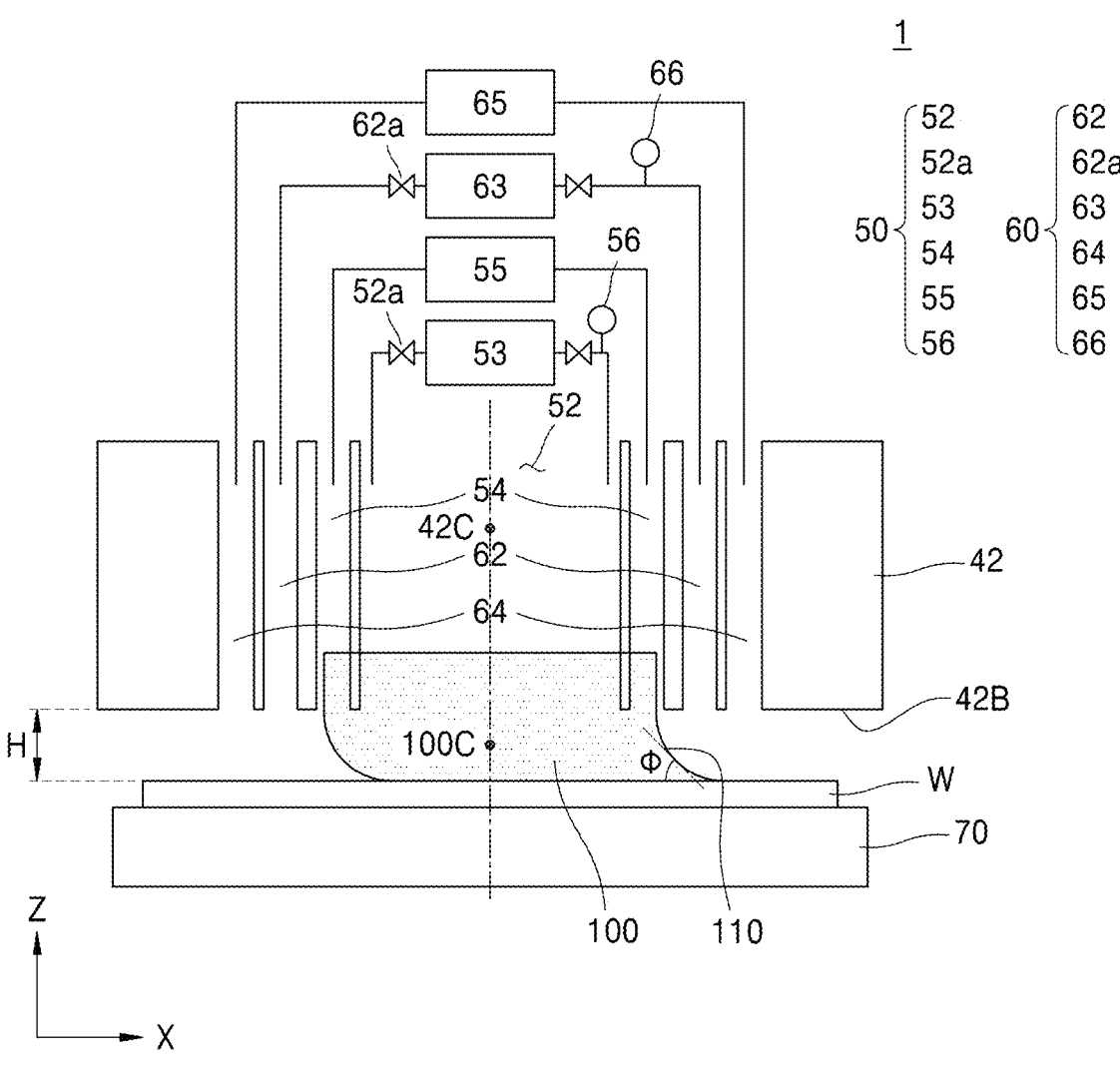
FIG. 2 is a schematic configuration diagram of a liquid supply unit according to an embodiment.

FIG. 1 is a schematic configuration diagram of an exposure apparatus according to an embodiment, and FIG. 2 is a schematic configuration diagram of a liquid supply unit according to an embodiment.

Referring to FIGS. 1 and 2, an exposure apparatus 1 may include a light source 10, an illumination optical system 20, a reticle stage 30, a projection optical system 40, a liquid supply unit 50, a vapor supply unit 60, and a wafer stage 70.

A wafer W may be disposed on the wafer stage 70. A photoresist film (not shown) may be disposed on the wafer W, and the photoresist film may become a photoresist pattern through an exposure process and a development process. The photoresist film may be formed on the wafer W through a photoresist composition coating process and a soft bake process, and a photoresist pattern formed through this process may be used as a mask to etch lower films or may be used as a mask for an ion implantation doping operation.

A plurality of shot areas are set on the wafer W, and each of the shot areas may include at least one die area. A size of a die area may vary according to the type of a desired semiconductor apparatus, and a size of each of the shot areas and the number of shot areas may be determined according to the size of the die area.

The light source 10 may generate light LG for exposing the wafer W. For example, the light source 10 may include a mercury lamp, an argon fluoride (ArF) laser apparatus, an extreme ultra violet (EUV) beam, and/or an electron beam.

In this regard, a wavelength of the light source 10 is an important factor in determining a resolution of the exposure apparatus 1. In other words, a resolution may be proportional to a wavelength and inversely proportional to a numerical aperture of an optical system, and the shorter the wavelength is, the better the resolution is. Therefore, as a KrF laser, the ArF laser, and a $F_2$ laser are used as the light source 10, the resolution of the exposure apparatus 1 may increase in this stated order.

The illumination optical system 20 may transmit light generated by the light source 10 onto a reticle RT. For example, the illumination optical system 20 may pattern the un-patterned light LG.

At this time, an image pattern of the reticle RT is substantially the same as an image to be transferred onto the wafer W, and the image corresponds to a desired photoresist pattern. In other words, illumination light illuminated onto the reticle RT is formed as projection light including image information through the reticle RT.

The illumination optical system 20 may include light intensity distribution control member 22, a light intensity control member 24, a blind member 26, and a light condensing lens 28.

The light intensity distribution control member 22 may improve uniformity of the light LG generated from the light source 10. For example, the light intensity distribution control member 22 may include a reflector, a dimmer, a lens, a louver, an optical filter, a diffuser and/or a reflective coating. The light intensity control member 24 may adjust a coherence factor (G) of the light LG. The light intensity control member 24 may include a dimmer, a light intensity switch, a controller, a ballast and/or a light sensor. The blind member 26 may block a portion of the light LG to define an illumination area on the reticle RT. The blind member 26 may include a light baffle, an aperture, a light shield and/or a light trap. Therefore, during exposure, exposure of unnecessary portions may be limited and/or prevented by limiting an illumination area by using the blind member 26. The light condensing lens 28 may condense, onto the reticle stage 30, the light LG passing through the blind member 26.

The light LG generated from the light source 10 is processed to have a state suitable for forming a photoresist pattern on the wafer W while passing through the illumination optical system 20. In this regard, the suitable state may refer to a quantity, intensity, density, or the like of the light LG corresponding to characteristics of a desired photoresist pattern.

The light LG that has passed through the illumination optical system 20 may be illuminated on the reticle RT disposed on the reticle stage 30. A plurality of circuit patterns are formed, on the reticle RT, to be projected onto the shot areas of the wafer W. While passing through the reticle RT, the light LG irradiated onto the reticle RT reflects image information of the circuit patterns. In this case, the reticle RT may move by the reticle stage 30 in a certain direction. A motor may be controlled by processing circuitry to move the reticle stage 30.

The light LG that has passed through the reticle RT may be irradiated onto the projection optical system 40. The projection optical system 40 may perform an exposure process so that the light LG reflecting the image information of the circuit patterns is irradiated toward the wafer W. The light LG that has passed through the reticle RT may pass through the projection optical system 40 and be irradiated onto a target C on the wafer W. The projection optical system 40 has a cylindrical shape as a whole, and may have an upper end portion facing the reticle RT and a lower end portion facing the wafer W.

A head portion 42 including at least a portion of each of a liquid supply line 52, a liquid recovery line 54, a vapor supply line 62, and/or a vapor recovery line 64 may be disposed at lower portion of the projection optical system 40.

The liquid supply unit 50 includes the liquid supply line 52 and the liquid recovery line 54, and may supply a liquid between the projection optical system 40 and the wafer W, for an immersion lithography process.

A liquid is supplied onto the wafer W through the liquid supply line 52, and a valve 52a for opening and closing the liquid supply line 52 may be installed on the liquid supply line 52. A liquid tank 53 is connected to one end of the liquid supply line 52, and a liquid filled in a storage space is stored in the liquid tank 53. The liquid filled in the storage space may have a higher refractive index than that of air. For example, the liquid may include pure water, ultrapure water, and/or isopropyl alcohol (IPA, $C_3H_8O$). In other words, the liquid serves as a kind of liquid lens. At least a portion of an immersion lens 100 may be drained to the outside of the exposure apparatus 1 through the liquid recovery line 54. A liquid recovered through the liquid recovery line 54 may be stored in a liquid recovery tank 55.

For example, in a plan view, the liquid supply line 52 is illustrated as being surrounded by the liquid recovery line 54, but the liquid recovery line 54 may be surrounded by the liquid supply line 52. In addition, each of the liquid supply line 52 and/or the liquid recovery line 54 may be provided in plurality in a direction away from a center 42C of the head portion 42. For example, each of the liquid supply line 52 and/or the liquid recovery line 54 may be arranged radially outward with respect to the center 42C of the head portion 42 to surround the center 42C of the head portion 42. The head portion 42 may have a lower surface 42B. The lower surface 42B of the head portion 42 may be arranged to face an upper surface of the wafer W. The lower surface 42B of the head portion 42 and the wafer W may define a space where the immersion lens 100 is arranged. The immersion lens 100 may be generated between the lower surface 42B of the head portion 42 and the upper surface of the wafer W.

According to an embodiment, the center 42C of the head portion 42 may be aligned with a center 100C of the stationary immersion lens 100 in a vertical direction (Z direction). According to another embodiment, the center 42C of the head portion 42 may not be aligned with the center 100C of the stationary immersion lens 100 in the vertical direction (Z direction).

The liquid supplied onto the wafer W through the liquid supply line 52 may form the immersion lens 100. The immersion lens 100 may be a material layer having a flow velocity, that is, flow. The light LG irradiated from the projection optical system 40 may pass through the immersion lens 100 and be irradiated onto the upper surface of the wafer W. As described above, the light LG of the exposure apparatus 1 may obtain improved resolution and DOF by the immersion lens 100. The immersion lens 100 may move in a horizontal direction (X direction and/or Y direction) on the wafer W. The immersion lens 100 may move by movement of the wafer stage 70. A motor may be controlled by processing circuitry to move the wafer stage 70.

According to an embodiment, a height H of the immersion lens 100 may be about 50 micrometers to about 500 micrometers. For example, a thickness from the lower surface 42B of the head portion 42 to the wafer W in the vertical direction (Z direction) may be about 50 micrometers to about 500 micrometers.

A meniscus 110 may be formed on one side of the immersion lens 100. The meniscus 110 may be formed by forming a contact angle of a certain angle with the wafer W. For example, the meniscus 110 may refer to a portion of the immersion lens 100, which forms a contact angle of about 90° or less with the wafer W. When the meniscus 110 has a low contact angle, the meniscus 110 becomes unstable and may be separated from the immersion lens 100. Therefore, it is necessary to increase a contact angle of the meniscus 110.

Herein, a direction parallel to a main surface of the wafer W may be defined as a horizontal direction (X direction and/or Y direction), and a direction perpendicular to the horizontal direction may be defined as a vertical direction (Z direction).

A liquid flow rate controller 56 for controlling a flow rate of a liquid supplied to the immersion lens 100 may be installed on the liquid supply line 52. For example, the liquid flow rate controller 56 may include a mass flow controller (MFC). For example, the liquid flow rate controller 56 may control the supply of the liquid to the immersion lens 100 at a desired and/or alternatively preset flow rate and pressure. For example, the liquid flow rate controller 56 may control the supply of the liquid to the immersion lens 100 at a flow rate of about 1 ml/min to about 1,000 ml/min.

The vapor supply unit 60 may be arranged apart from the liquid supply unit 50 in the horizontal direction (X direction and/or Y direction). In a plan view, the vapor supply unit 60 may be arranged outside the liquid supply unit 50. In a plan view, the vapor supply unit 60 may be arranged to surround the liquid supply unit 50. Vapors are supplied onto the wafer W and/or the immersion lens 100 through the vapor supply line 62, and a valve 62a for opening and closing the vapor supply line 62 may be installed on the vapor supply line 62. A vapor tank 63 is connected to one end of the vapor supply line 62, and vapors may be stored in the vapor tank 63. Although not shown, the vapor tank 63 may further include a heater (not shown) which forms vapors by evaporating a solution therein. Vapors recovered by the vapor recovery line 64 may be stored in a vapor recovery tank 65.

For example, in a plan view, the vapor supply line 62 is illustrated as being surrounded by the vapor recovery line 64, but the vapor recovery line 64 may be surrounded by the vapor supply line 62. In addition, each of the vapor supply line 62 and/or the vapor recovery line 64 may be provided in plurality in a direction away from the center 42C of the head portion 42. For example, each of the vapor supply line 62 and/or a plurality of vapor recovery lines 64 may be arranged radially outward with respect to the center 42C of the head portion 42 to surround the center 42C of the head portion 42.

The vapors may include volatile materials. The vapors may have a low surface tension, high vapor pressure, and/or high molecular weight. For example, the vapors may include a material having a solubility of about 10% or more in the liquid included in the immersion lens 100. For example, the vapors may include a material having a solubility of about 10% to about 20% in the liquid included in the immersion lens 100. For example, the vapors may include a material having a solubility of about 10% or more in water. For example, the vapors may include a material having a solubility of about 10% to about 20% in water. For example, the vapors may have a solubility of about 50 $kg/m^3$ to about 200 $kg/m^3$ in the liquid. For example, the vapors may have a solubility of about 50 $kg/m^3$ to about 200 $kg/m^3$ in water. For example, the vapors may include acetone ($CH_3COCH_3$), methyl acetate ($C_3H_6O_2$), and/or methyl ethyl ketone ($CH_3COC_2H_5$).

The vapors may have a lower surface tension than that of the liquid. For example, the vapors may have a lower surface tension than that of water. For example, the vapors may include a material that changes a capillary number of the liquid included in the immersion lens 100. For example, the vapors may include a material that reduces a capillary number of the liquid included in the immersion lens 100. When a capillary number of the immersion lens 100 decreases, a contact angle Ø of the meniscus 110 may increase.

The vapors having a low surface tension are in contact with the immersion lens 100, and thus a capillary number of the immersion lens 100 may be reduced. Therefore, the vapors may increase the contact angle Ø of the meniscus 110 of the immersion lens 100. When the contact angle Ø of the meniscus 110 increases, stability of the meniscus 110 may increase. In addition, when the contact angle Ø of the meniscus 110 increases, a length of the meniscus 110 may decrease. Therefore, when the contact angle Ø of the meniscus 110 increases, stability of the meniscus 110 may increase. Therefore, when the contact angle Ø of the meniscus 110 increases, stability of the exposure apparatus 1 may increase.

In a case where the meniscus 110 of the immersion lens 100 is in contact with the vapors, the vapors have a low surface tension, and thus, due to a Marangoni effect, the contact angle Ø of the meniscus 110 of the immersion lens 100 may increase. Due to a difference between a surface tension of the meniscus 110 and a surface tension of the vapors, the contact angle Ø of the meniscus 110 may increase.

For example, the vapors may include a material that changes the contact angle Ø of the meniscus 110. For example, the vapors may include a material that increases the contact angle Ø of the meniscus 110.

The vapor supply line 62 and/or the vapor recovery line 64 may be aligned with the immersion lens 100 in the vertical direction (Z direction). In other words, vapors supplied from the vapor supply line 62 may be directly sprayed to the immersion lens 100. The vapor supply line 62 and/or the vapor recovery line 64 may be aligned with the meniscus 110 of the immersion lens 100 in the vertical direction (Z direction). In other words, vapors supplied from the vapor supply line 62 may be directly sprayed to the meniscus 110 of the immersion lens 100. For example, the vapor supply line 62 and/or the vapor recovery line 64 may be aligned with at least a portion of the meniscus 110 of the immersion lens 100 in the vertical direction (Z direction). A horizontal distance L from the center 42C of the head portion 42 to the vapor supply line 62 and/or the vapor recovery line 64 may satisfy Equation 1.

$$L = R \times \frac{1}{\sin\varnothing} \qquad \text{< Equation 1 >}$$

In Equation 1, L may be a horizontal distance from the center 42C of the head portion 42 to the vapor supply line 62 and/or the vapor recovery line 64, R may be a radius of a horizontal space defined by the liquid supply unit 50, and Ø may be an angle between the meniscus 110 and the wafer W. In this regard, Ø may be a contact angle of the meniscus 110.

For example, when the contact angle Ø of the meniscus 110 is about 30°, the meniscus 110 of the immersion lens 100 may be unstable. Therefore, the vapor supply unit 60 may be arranged in such a manner that the contact angle Ø of the meniscus 110 is about 45° or more. In other words, the vapor supply line 62 and/or the vapor recovery line 64 may be arranged in such a manner that the contact angle 0 of the meniscus 110 is about 45° or more. Therefore, the horizontal distance L from the center 100C of the immersion lens 100 to the vapor supply line 62 and/or the vapor recovery line 64 may be less than or equal to about √2 times a radius R of the horizontal space defined by the liquid supply unit 50. In other words, the horizontal distance L from the center 100C of the immersion lens 100 to the vapor supply line 62 and/or the vapor recovery line 64 may be less than or equal to about √2 times a distance from the center 100C of the immersion lens 100 to the liquid supply line 52 and/or the liquid recovery line 54. In other words, the horizontal distance L from the center 100C of the immersion lens 100 to the vapor supply line 62 and/or the vapor recovery line 64 may be less than or equal to about √2 times a radius of the stationary immersion lens 100.

In addition, the horizontal distance L from the center 100C of the immersion lens 100 to the vapor supply line 62 and/or the vapor recovery line 64 may be greater than a distance R from the center 100C of the immersion lens 100 to the liquid supply line 52 and/or the liquid recovery line 54. In a plan view, the vapor supply line 62 and/or the vapor recovery line 64 may be arranged outside the liquid supply line 52 and/or the liquid recovery line 54. Therefore, the horizontal distance L from the center 100C of the immersion lens 100 to the vapor supply line 62 and/or the vapor recovery line 64 may be greater than about 1 time to not more than about √2 times the radius R of the horizontal space defined by the liquid supply unit 50.

In addition, the vapor supply line 62 and/or the vapor recovery line 64 may be aligned only with the meniscus 110 of the immersion lens 100 in the vertical direction (Z direction). In other words, vapors supplied by the vapor supply line 62 may be supplied so as to be aligned only with the meniscus 110 of the immersion lens 100 in the vertical direction (Z direction).

A vapor flow rate controller 66 for controlling a flow rate of vapors supplied to the immersion lens 100 may be installed on the vapor supply line 62. For example, the vapor flow rate controller 66 may include an MFC. For example, the vapor flow rate controller 66 may control the supply of the vapors to the immersion lens 100 at a desired and/or alternatively preset flow rate and pressure.

The wafer stage 70 may support the wafer W while an immersion lithography process is in progress. The wafer stage 70 may include a driving unit (not shown) for moving the wafer stage 70 in the horizontal direction (X direction and/or Y direction). For example, the driving unit may rotate the wafer W. The driving unit may include a motor, processing circuitry for controlling the motor, and power circuitry for powering the motor.

In general exposure apparatuses, vapors supplied to a meniscus through a vapor supply unit lower an effective surface tension of the meniscus, thereby reducing a contact angle between the meniscus and a wafer. Therefore, stability of an immersion lens is relatively low. In addition, in general exposure apparatuses, vapors are supplied to be apart from the immersion lens in a horizontal direction, and thus the vapors may not effectively act on the immersion lens.

In contrast, in the exposure apparatus 1 of inventive concepts, vapors supplied to the meniscus 110 through the vapor supply unit 60 increase an effective surface tension of the meniscus 110, thereby increasing the contact angle Ø between the meniscus 110 and the wafer W. Therefore, stability of the immersion lens 100 may be relatively high. In addition, in the exposure apparatus 1 of inventive concepts, vapors supplied through the vapor supply unit 60 are in direct contact with the meniscus 110, and thus stability of the immersion lens 100 may be relatively high.

Figure 3:
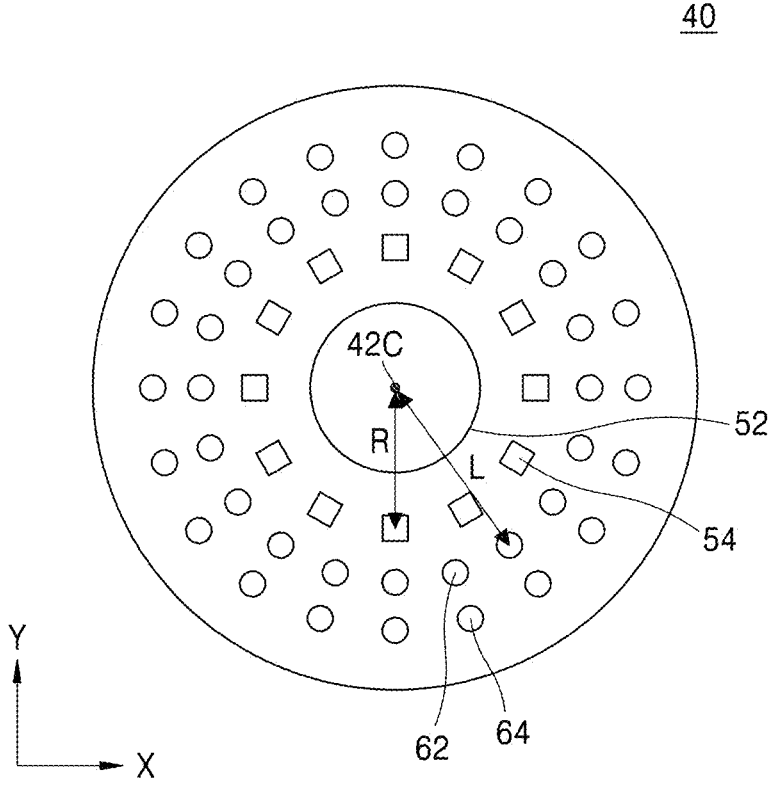
FIG. 3 is a plan view of a projection optical system according to an embodiment.
Figure 4:
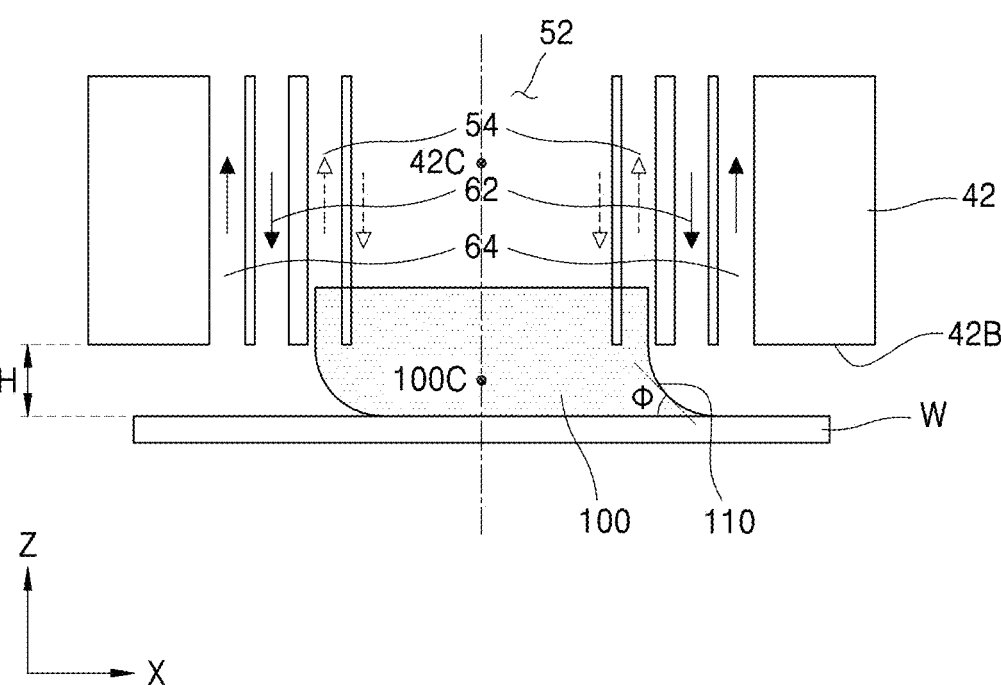
FIG. 4 is a layout view illustrating an arrangement of an immersion lens, a liquid supply unit, and a vapor supply unit, according to an embodiment.

FIG. 3 is a plan view of a projection optical system according to an embodiment, and FIG. 4 is a layout view illustrating an arrangement of an immersion lens, a liquid supply unit, and a vapor supply unit, according to an embodiment.

Referring to FIGS. 2 to 4, in a plan view, the liquid supply line 52 and a plurality of liquid recovery lines 54 may be arranged adjacent to a center 40C of the projection optical system 40. In a plan view, the liquid supply line 52 and the plurality of liquid recovery lines 54 may be arranged to surround the center 42C of the head portion 42. In a plan view, a horizontal space defined by the liquid supply line 52 and the plurality of liquid recovery lines 54 may be circular.

Each of the liquid supply line 52 and/or the plurality of liquid recovery lines 54 may extend in a direction perpendicular to a main surface of the wafer W. In other words, each of the liquid supply line 52 and/or the plurality of liquid recovery lines 54 may extend in the vertical direction (Z direction). Each of the liquid supply line 52 and/or the plurality of liquid recovery lines 54 may be defined by a needle and/or a tube. A shape of a horizontal cross section of each of the liquid supply line 52 and/or the plurality of liquid recovery lines 54 may be circular, elliptical, polygonal, and/or atypical. Although not shown in FIG. 3, each of the liquid supply line 52 and/or the plurality of liquid recovery lines 54, which are adjacent to each other, may be combined together and integrally formed. In another embodiment, each of the liquid supply line 52 and/or the plurality of liquid recovery lines 54 may extend in a direction oblique to the vertical direction (Z direction). In other words, each of the liquid supply line 52 and/or the plurality of liquid recovery lines 54 may extend in a direction oblique to the direction perpendicular to the main surface of the wafer W.

In an embodiment, in a plan view, the plurality of liquid recovery lines 54 may be arranged outside the liquid supply line 52. A center of the liquid supply line 52 may coincide with the center 42C of the head portion 42. Horizontal distances from the center 42C of the head portion 42 to the respective liquid recovery lines 54 may be the same. For example, each of the plurality of liquid recovery lines 54 may be disposed on a circumference of a circle centered on the center 42C of the head portion 42.

In a plan view, the vapor supply unit 60 may be arranged to surround the liquid supply unit 50. The vapor supply unit 60 may include a plurality of vapor supply lines 62 and a plurality of vapor recovery lines 64. In a plan view, a horizontal space defined by the vapor supply unit 60 may be circular. The plurality of vapor supply lines 62 may have a constant horizontal separation distance from the center 42C of the head portion 42, and may be arranged in a circular shape. The plurality of vapor recovery lines 64 may be arranged in a circular shape with respect to the center 42C of the head portion 42.

Each of the plurality of vapor supply lines 62 and/or the plurality of vapor recovery lines 64 may extend in the direction perpendicular to the main surface of the wafer W. In other words, each of the plurality of vapor supply lines 62 and/or the plurality of vapor recovery lines 64 may extend in the vertical direction (Z direction). Each of the plurality of vapor supply lines 62 and/or the plurality of vapor recovery lines 64 may be defined by a needle and/or a tube. A shape of a horizontal cross section of each of the plurality of vapor supply lines 62 and/or the plurality of vapor recovery lines 64 may be circular, elliptical, polygonal, and/or atypical. Although not shown in FIG. 3, each of the plurality of vapor supply lines 62 and/or the plurality of vapor recovery lines 64, which are adjacent to each other, may be combined together and integrally formed. In another embodiment, each of the plurality of vapor supply lines 62 and/or the plurality of vapor recovery lines 64 may extend in a direction oblique to the vertical direction (Z direction). In other words, each of the plurality of vapor supply lines 62 and/or the plurality of vapor recovery lines 64 may extend in a direction oblique to the direction perpendicular to the main surface of the wafer W.

In an embodiment, in a plan view, the plurality of vapor recovery lines 64 may be arranged outside the plurality of vapor supply lines 62. In another embodiment, the plurality of vapor recovery lines 64 may be arranged inside the plurality of vapor supply lines 62. Horizontal distances from the center 42C of the head portion 42 to the respective vapor supply lines 62 may be the same. For example, each of the plurality of vapor supply lines 62 may be disposed on a circumference of a circle centered on the center 42C of the head portion 42. Horizontal distances from the center 42C of the head portion 42 to the respective vapor recovery lines 64 may be the same. For example, each of the plurality of vapor recovery lines 64 may be disposed on a circumference of a circle centered on the center 42C of the head portion 42.

A diameter of the liquid supply line 52 may be greater than a diameter of each of the plurality of liquid recovery lines 54. For example, a diameter of the liquid supply line 52 may be greater than or equal to about twice a diameter of each of the plurality of liquid recovery lines 54.

Each of the plurality of liquid recovery lines 54 may have a diameter of about 1 mm to about 8 mm, and may be arranged in the head portion 42. In addition, each of the plurality of vapor supply lines 62 and/or the plurality of vapor recovery lines 64 may have a diameter of about 2 mm to about 6 mm, and may be arranged in the head portion 42. In addition, each of the liquid supply line 52 and/or the plurality of liquid recovery lines 54 may have a separation distance of about 0.1 mm to about 3 mm, and may be arranged in the head portion 42. In addition, each of the plurality of vapor supply lines 62 and/or the plurality of vapor recovery lines 64 may have a separation distance of about 0.1 mm to about 3 mm, and may be arranged in the head portion 42.

According to an embodiment, each of the liquid supply line 52 and/or the plurality of liquid recovery lines 54 may be apart from each other at regular intervals, and may be arranged in the head portion 42. In addition, each of the plurality of vapor supply lines 62 and/or the plurality of vapor recovery lines 64 may be apart from each other at regular intervals, and may be arranged in the head portion 42.

In another embodiment, each of the liquid supply line 52 and/or the plurality of liquid recovery lines 54 may have different separation distances, and may be arranged in the head portion 42. In addition, each of the plurality of vapor supply lines 62 and/or the plurality of vapor recovery lines 64 may have different separation distances, and may be arranged in the head portion 42.

In another embodiment, some of the liquid supply line 52 and/or the plurality of liquid recovery lines 54 may have different separation distances, and may be arranged in the head portion 42. In addition, some of the plurality of vapor supply lines 62 and/or the plurality of vapor recovery lines 64 may have different separation distances, and may be arranged in the head portion 42. Others of the liquid supply line 52 and/or the plurality of liquid recovery lines 54 may be apart from each other at regular intervals, and may be arranged in the head portion 42. Others of the plurality of vapor supply lines 62 and/or the plurality of vapor recovery lines 64 may be apart from each other at regular intervals, and may be arranged in the head portion 42.

As described above, the horizontal distance L from the center 42C of the head portion 42 to the plurality of vapor supply lines 62 may satisfy the radius R of the horizontal space defined by the liquid supply unit 50 and Equation 1 above. For example, the radius R of the horizontal space defined by the liquid supply unit 50 may be a horizontal radius of the meniscus 110 when the meniscus 110 is stationary. For example, the radius R of the horizontal space defined by the liquid supply unit 50 may be a horizontal separation distance from the center 42C of the head portion 42 to the liquid recovery line 54. In another embodiment, the radius R of the horizontal space defined by the liquid supply unit 50 may be a horizontal separation distance from the center 42C of the head portion 42 to the liquid supply line 52. In an embodiment, the radius R may be a horizontal distance from the center 42C of the head portion 42 to a center of a corresponding one of the liquid recovery lines 54. In an embodiment, the horizontal distance L may be a distance from the center 42C of the head portion 42 to a center of a corresponding one of the vapor supply lines 62.

Figure 5:
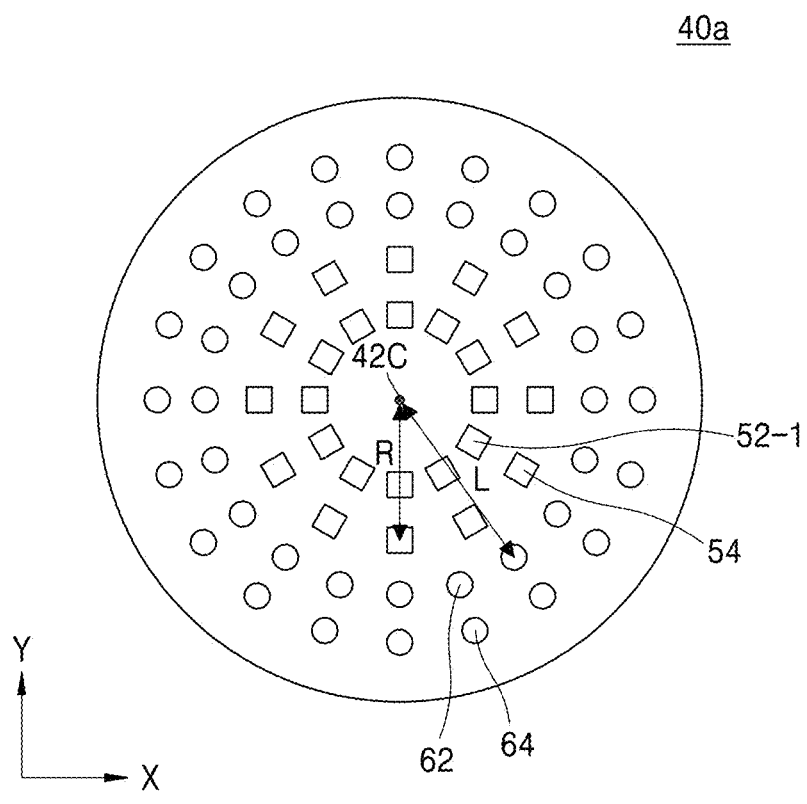
FIG. 5 is a plan view of a projection optical system according to an embodiment.

FIG. 5 is a plan view of a head portion of a projection optical system, according to an embodiment.

A projection optical system 40a of FIG. 5 may include a plurality of liquid supply lines 52-1, the plurality of liquid recovery lines 54, the plurality of vapor supply lines 62, and the plurality of vapor recovery lines 64. The plurality of liquid recovery lines 54, the plurality of vapor supply lines 62, and the plurality of vapor recovery lines 64 of FIG. 5 are substantially the same as the plurality of liquid recovery lines 54, the plurality of vapor supply lines 62, and the plurality of vapor recovery lines 64 of FIG. 3, and thus only the plurality of liquid supply lines 52-1 will be described hereinafter.

Referring to FIGS. 1 and 5, the plurality of liquid recovery lines 54 may be arranged outside the plurality of liquid supply lines 52-1. In another embodiment, the plurality of liquid recovery lines 54 may be arranged inside the plurality of liquid supply lines 52-1. For example, each of the plurality of liquid supply lines 52-1 may be disposed on a circumference of a circle centered on the center 42C of the head portion 42.

According to an embodiment, each of the plurality of liquid supply lines 52-1 may have the same diameter as that of each of the plurality of liquid recovery lines 54. In another embodiment, each of the plurality of liquid supply lines 52-1 may have a different diameter from that of each of the plurality of liquid recovery lines 54. For example, each of the plurality of liquid supply lines 52-1 may have a diameter of about 1 mm to about 8 mm, and may be arranged in the head portion 42.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. An immersion lithographic system comprising:
   a wafer stage;
   a projection optical system on the wafer stage and configured to irradiate light toward the wafer stage;
   a liquid supply unit configured to supply a liquid between the wafer stage and the projection optical system to form an immersion-fluid lens through which the light is transmitted; and
   a vapor supply unit configured to supply vapors to the immersion-fluid lens,
   wherein the immersion-fluid lens comprises a meniscus forming a contact angle of 90° or less with a wafer on the wafer stage,
   wherein the vapor supply unit includes a vapor supply line configured to supply the vapors to the immersion-fluid lens,
   wherein at least an edge portion of the meniscus of the immersion-fluid lens and the vapor supply line of the vapor supply unit are aligned in a vertical direction such that the vapor supply line is over the edge portion of the meniscus in the vertical direction, and
   wherein a thickness of the edge portion of the meniscus is less than a thickness of an inner portion of the immersion-fluid lens, and the inner portion of the immersion-fluid lens is under and aligned in the vertical direction with a liquid supply line of the liquid supply unit.

2. The immersion lithographic system of claim 1, wherein the vapor supply unit is configured to increase the contact angle of the meniscus with the wafer by supplying the vapors to the immersion-fluid lens.

3. The immersion lithographic system of claim 1, wherein the vapor supply unit is configured to reduce a length of the meniscus by supplying the vapors to the immersion-fluid lens.

4. The immersion lithographic system of claim 1, wherein the vapor supply unit comprises:
   a vapor recovery line configured to recover the vapors supplied to the immersion-fluid lens.

5. The immersion lithographic system of claim 1, wherein,
   in a plan view, the vapor supply unit is arranged outside the liquid supply unit.

6. The immersion lithographic system of claim 1, wherein the vapors comprise at least one of methyl acetate and methyl ethyl ketone.

7. An immersion lithographic system comprising:
   a wafer stage;
   a projection optical system on the wafer stage and configured to irradiate light toward the wafer stage;
   a liquid supply unit configured to supply a liquid between the wafer stage and the projection optical system to form an immersion-fluid lens through which the light is transmitted, wherein the immersion-fluid lens comprises a meniscus forming a contact angle of 90° or less with a wafer on the wafer stage,
   the liquid supply unit including at least one liquid supply line and a plurality of liquid recovery lines; and
   a vapor supply unit configured to supply vapors between the wafer stage and the projection optical system, the vapor supply unit including a plurality of vapor supply lines and a plurality of vapor recovery lines, wherein
   the plurality of vapor supply lines are configured to supply the vapors to the immersion-fluid lens,
   the projection optical system includes a head portion disposed at a lower portion of the projection optical system,
   the at least one liquid supply line, the plurality of liquid recovery lines, the plurality of vapor supply lines, and the plurality of vapor recovery lines are arranged in the head portion, and
   the vapors supplied from the vapor supply unit reduce a capillary number of the immersion-fluid lens,
   wherein at least an edge portion of the meniscus of the immersion-fluid lens and the plurality of vapor supply lines of the vapor supply unit are aligned in a vertical direction such that the plurality of vapor supply lines are over the edge portion of the meniscus in the vertical direction, wherein a thickness of the edge portion of the meniscus is less than a thickness of an inner portion of the immersion-fluid lens, and the inner portion of the immersion-fluid lens is under and aligned in the vertical direction with the at least one liquid supply line.

8. The immersion lithographic system of claim 7, wherein the at least one liquid supply line, the plurality of liquid recovery lines, the plurality of vapor supply lines, and the plurality of vapor recovery lines each penetrate the head portion in the vertical direction.

9. The immersion lithographic system of claim 7, wherein, in a plan view, the plurality of vapor supply lines are surrounded by the plurality of vapor recovery lines.

10. The immersion lithographic system of claim 7, wherein a distance from a center of the head portion to the liquid supply unit and a distance from the center of the head portion to the vapor supply unit satisfy Equation 1:

$$L = R \times \frac{1}{\sin\emptyset} \qquad \text{[Equation 1]}$$

herein, in Equation 1,

L is a distance from the center of the head portion to the vapor supply unit,

R is a distance from the center of the head portion to the liquid supply unit, and Ø is an angle between the meniscus and the wafer.

11. The immersion lithographic system of claim 7, wherein a distance from a center of the head portion to the vapor supply unit is 1 time to √2 times a distance from the center of the head portion to the liquid supply unit.

12. The immersion lithographic system of claim 7, wherein the plurality of liquid recovery lines, the plurality of vapor supply lines, and the plurality of vapor recovery lines are arranged on circumferences of a plurality of circles centered on a center of the head portion.

13. The immersion lithographic system of claim 7, wherein the vapors have a solubility of 10% to 20% in the liquid included in the immersion-fluid lens.

14. The immersion lithographic system of claim 7, wherein the liquid comprises water, and the vapors comprise at least one of acetone, methyl acetate, and methyl ethyl ketone.

15. An immersion lithographic system comprising:

a light source configured to generate and irradiate light;

an illumination optical system configured to irradiate the light to a reticle;

a wafer stage;

a projection optical system facing the wafer stage and configured to irradiate, toward the wafer stage, the light that has passed through the reticle;

a liquid supply unit configured to supply a liquid between the wafer stage and the projection optical system to form an immersion-fluid lens through which the light is transmitted, and comprising at least one liquid supply line and a plurality of liquid recovery lines, wherein the immersion-fluid lens comprises a meniscus forming a contact angle of 90° or less with a wafer on the wafer stage; and a vapor supply unit configured to supply vapors between the wafer stage and the projection optical system, the vapor supply unit including a plurality of vapor supply lines and a plurality of vapor recovery lines, wherein the projection optical system includes a head portion at a lower portion of the projection optical system, the at least one liquid supply line, the plurality of liquid recovery lines, the plurality of vapor supply lines, and the plurality of vapor recovery lines are in the head portion, the vapors supplied from the vapor supply unit reduce a capillary number of the immersion-fluid lens, at least an edge portion of a meniscus of the immersion-fluid lens and the plurality of vapor supply lines of the vapor supply unit are aligned in a vertical direction such that the plurality of vapor supply lines are over the edge portion of the meniscus in the vertical direction, a thickness of the edge portion of the meniscus is less than a thickness of an inner portion of the immersion-fluid lens, and the inner portion of the immersion-fluid lens is under and aligned in the vertical direction with the at least one liquid supply line of the liquid supply unit.

16. The immersion lithographic system of claim 15, wherein a distance from a center of the head portion to the vapor supply unit is 1 time to √2 times a radius of a space defined by the liquid supply unit.

17. The immersion lithographic system of claim 15, further comprising:

a vapor flow rate controller configured to control a flow rate of the vapors supplied to the meniscus.

18. The immersion lithographic system of claim 15, wherein the contact angle of the immersion-fluid lens is 30° or more.

19. The immersion lithographic system of claim 15, wherein a height of the immersion-fluid lens is 50 micrometers to 500 micrometers.

\* \* \* \* \*